United States Patent
Rokugawa et al.

(10) Patent No.: US 7,068,747 B2
(45) Date of Patent: Jun. 27, 2006

(54) DATA DECISION CIRCUIT USING CLOCK SIGNAL WHICH HAS PHASE OPTIMIZED WITH RESPECT TO PHASE OF INPUT DATA SIGNAL

(75) Inventors: Hiroyuki Rokugawa, Kawasaki (JP); Tadashi Ikeuchi, Kawasaki (JP); Daisuke Yamazaki, Kawasaki (JP); Masaaki Kawai, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 710 days.

(21) Appl. No.: 09/952,191

(22) Filed: Sep. 14, 2001

(65) Prior Publication Data

US 2002/0153476 A1   Oct. 24, 2002

(30) Foreign Application Priority Data

Apr. 18, 2001   (JP)   ............................. 2001-119438

(51) Int. Cl.
   *H04L 7/02*   (2006.01)

(52) U.S. Cl. .................. 375/360; 375/326; 375/376
(58) Field of Classification Search ............... 375/326, 375/354, 359, 360, 362, 371, 373, 376; 713/400, 713/50, 503, 600
See application file for complete search history.

(56) References Cited

U.S. PATENT DOCUMENTS

| | | | | |
|---|---|---|---|---|
| 4,371,974 A | * | 2/1983 | Dugan | 375/328 |
| 5,161,173 A | * | 11/1992 | Nordby | 375/373 |
| 6,028,898 A | * | 2/2000 | Sparks et al. | 375/317 |
| 6,778,102 B1 | * | 8/2004 | Grunnet-Jepsen et al. | 341/50 |

FOREIGN PATENT DOCUMENTS

| | | | |
|---|---|---|---|
| JP | 2000068991 | | 3/2000 |
| JP | 2004048721 A | * | 5/2002 |

* cited by examiner

*Primary Examiner*—Kevin Burd
*Assistant Examiner*—Freshteh Aghdam
(74) *Attorney, Agent, or Firm*—Katten Muchin Rosenman LLP

(57) ABSTRACT

In a data decision circuit: a clock generation unit generates a clock signal based on a phase difference signal so that the clock signal has an optimum phase with respect to a phase of an input data signal; a data determination unit determines data values carried by the input data signal, by using the clock signal; a phase-difference detection unit detects a rising-side phase difference and a falling-side phase difference, where the rising-side phase difference is a phase difference between a rising of the input data signal and a next transition in the clock signal, and the falling-side phase difference is a phase difference between the transition and a next falling of the input data signal; and a phase-difference-signal generation unit generates the phase difference signal so as to represent a difference between the rising-side phase difference and the falling-side phase difference.

7 Claims, 13 Drawing Sheets

DATA DECISION CIRCUIT USING CLOCK SIGNAL WHICH HAS PHASE OPTIMIZED WITH RESPECT TO PHASE OF INPUT DATA SIGNAL

BACKGROUND OF THE INVENTION

1) Field of the Invention

The present invention relates to a data decision circuit which compares phases of an input data signal and a determined data signal, and determines a phase relationship between the input data signal and the clock signal in order to determine data values carried by the input data signal. The present invention also relates to an optical receiver apparatus which receives an optical signal and determines data values carried by the optical signal.

2) Description of the Related Art

Recently, areas in which broadband transmission of information (such as moving images) is used are rapidly expanding. For example, technologies for transmitting high-speed signals have been introduced into subscriber systems and systems inside switching centers, as well as trunk line systems. Under such circumstances, demands for a digital transmission system which enables low-cost, large-capacity signal transmission are increasing.

In receivers used in digital transmission systems, it is essential to accurately discriminate "0" and "1" bits and determine (recover) data values carried by transmitted data signals. In order to achieve the accurate determination and recovery of data values, data decision circuits are used. The data decision circuits compare phases of an input data signal and a determined data signal representing determined data values, and control a phase of a decision clock so as to realize an appropriate phase relationship between the phases of the input data signal and the clock signal.

The conventional data decision circuits detect only rising or only falling of the input data signal, and controls phases of transition points of a clock signal which is used in data decision, so as to maintain a predetermined phase difference between the transition points of the clock signal and the detected rising or falling of the input data signal, for example, as disclosed in Japanese unexamined patent publication (Kokai) No. 2000-68991.

However, in the conventional data decision circuits as above, when a pulse width (or a duty ratio) of an input data signal varies, it is difficult to accurately determine data values carried by the input data signal, and therefore reliability of data decision decreases.

The above problem in the conventional data decision circuits is explained in detail with reference to FIGS. 13(A) to 13(C) for the case where a conventional data decision circuit detects rising of an input data signal, and controls phases of transition points of a clock signal. That is, it is assumed that this data decision circuit detects rising of the input data signal, and controls transition points of the clock signal for use in data decision so as to maintain a predetermined phase (time) difference P between each rising of the input data signal and a transition (rising) of the clock signal which occurs subsequently to the rising of the input data signal. Usually, the predetermined phase (time) difference P is equal to one-half of a timeslot of the input data signal or the duration of the "1" state in one bit of the input data signal, as illustrated in FIG. 13(A).

If the duty ratio of the input data signal does not vary, the conventional data decision circuit operates without the above problem. However, in actual operations of data decision circuits, waveshapes of transmitted and received signals vary due to variations in temperature and power supply, and therefore duty ratios of input data signals also vary.

When the duty ratio of the input data signal greatly decreases (i.e., the duration of the "1" state decreases), for example, as illustrated in FIG. 13(B), the time from the rising of the clock signal to the subsequent falling of the input data signal (i.e., a phase margin for holding the data value "1") also decreases since the phase (time) difference P between the rising of the input data signal and a rising of the clock signal occurring subsequently to the rising of the input data signal is controlled to be constant. Therefore, the input data signal is likely to be incorrectly recovered (determined).

Further, when the duty ratio of the input data signal increases (i.e., the duration of the "1" state increases), for example, as illustrated in FIG. 13(C), the above problem of the decrease in the phase margin for the data holding operation does not arise. However, the time from the falling of the input data signal to the next transition (rising) of the clock signal (i.e., a phase margin for setting up a data holding circuit) decreases. Therefore, the operation of the data decision circuit for determining a data bit "0" following a data bit "1" is likely to become unstable.

As described above, in the operations of the conventional data decision circuits, the operation becomes unstable when the duty ratio of the input data signal varies, since the phase (time) difference P between each rising (or each falling) of the input data signal and a rising or falling of the clock signal is controlled to be constant.

SUMMARY OF THE INVENTION

An object of the present invention is to provide a data decision circuit which makes accurate data decision for improving quality and reliability of digital transmission.

Another object of the present invention is to provide an optical receiver apparatus in which accurate data decision is made for improving quality and reliability of optical transmission.

(1) According to the first aspect of the present invention, there is provided a data decision circuit comprising: a clock generation unit which generates a clock signal based on a phase difference signal so that the clock signal has an optimum phase with respect to a phase of an input data signal; a data determination unit which determines data values carried by the input data signal, by using the clock signal, and generates a determined data signal representing the determined data values; a phase-difference detection unit which detects a rising-side phase difference and a falling-side phase difference, where the rising-side phase difference is a phase difference between a rising of the input data signal and a transition in the clock signal which occurs subsequently to the rising of the input data signal, and the falling-side phase difference is a phase difference between the transition in the clock signal and a falling of the input data signal which occurs subsequently to the transition in the clock signal; and a phase-difference-signal generation unit which generates the phase difference signal so as to represent a difference between the rising-side phase difference and the falling-side phase difference.

As described above, in the data decision circuit according to the first aspect of the present invention, the rising-side phase difference (i.e., the phase difference between a rising of the input data signal and a transition in the clock signal which occurs subsequently to the rising of the input data signal) and the falling-side phase difference (i.e., the phase difference between the transition in the clock signal and a falling of the input data signal which occurs subsequently to the transition in the clock signal) are detected, and the clock signal used for data decision is generated so that the phase of the clock signal is maintained at an optimum phase with respect to the input data signal. Then, the data value of each bit is determined by using the generated clock signal. Therefore, even when the duty ratio of the input data signal varies, the data can value be determined with high accuracy by flexibly adapting the phase of the clock signal to the variation in the duty ratio of the input data signal. Thus, when the data decision circuit according to the first aspect of the present invention is used, the quality and reliability of digital transmission can be improved.

The data decision circuit according to the first aspect of the present invention may have one or any possible combination of the following additional features (i) to (vii).

(i) The clock generation unit may be realized by a voltage controlled oscillator, and may generate the clock signal so as to minimize the difference between the rising-side phase difference and the falling-side phase difference.

(ii) The phase-difference detection unit may generate a first pulse representing the rising-side phase difference by obtaining a logical product of the input data signal and an inversion of the determined data signal, and a second pulse representing the falling-side phase difference by obtaining a logical product of the input data signal and the determined data signal.

(iii) When the data decision circuit according to the first aspect of the present invention has the above feature (ii), the phase-difference-signal generation unit may comprise a first filter which obtains an average of the first pulse so as to produce a first average signal representing the average of said first pulse, a second filter which obtains an average of the second pulse so as to produce a second average signal representing the average of said second pulse, and an amplifier which generates and amplifies a difference between the first average signal and the second average signal so as to produce the phase difference signal and negatively feed back the phase difference signal to the clock generation unit.

(iv) The phase-difference detection unit comprises a final-bit detection unit which detects a final bit of a plurality of successive bits having an identical value, and generates a pulse having a width corresponding to only the final bit, for use in detection of the falling-side phase difference, when the input data signal carries the plurality of successive bits, and a falling-side delay adjustment unit which allows adjustment of a delay in the input data signal supplied to the phase-difference detection unit so as to compensate for a delay which is caused in the determined data signal by the final-bit detection unit.

(v) When the data decision circuit according to the first aspect of the present invention has the above feature (iv), the falling-side delay adjustment unit may allow external adjustment of the delay in the input data signal supplied to the phase-difference detection unit.

(vi) When the data decision circuit according to the first aspect of the present invention has the above feature (iv), the phase-difference detection unit may further comprise a rising-side delay adjustment unit which is arranged in a portion of the phase-difference detection unit in which the rising-side phase difference is detected, and allows adjustment of a delay in detection of the rising-side phase difference in order to compensate for variations in a delay caused during detection of the falling-side phase difference.

(2) According to the second aspect of the present invention, there is provided an optical receiver apparatus including an optical receiver unit and a data decision circuit. The optical receiver unit receives an optical signal and converts the optical signal into an electric signal as an input data signal. The data decision circuit comprises: a clock generation unit which generates a clock signal based on a phase difference signal so that the clock signal has an optimum phase with respect to a phase of the input data signal; a data determination unit which determines data values carried by the input data signal, by using the clock signal, and generates a determined data signal representing the determined data values; a phase-difference detection unit which detects a rising-side phase difference and a falling-side phase difference, where the rising-side phase difference is a phase difference between a rising of the input data signal and a transition in the clock signal which occurs subsequently to the rising of the input data signal, and the falling-side phase difference is a phase difference between the transition in the clock signal and a falling of the input data signal which occurs subsequently to the transition in the clock signal; and a phase-difference-signal generation unit which generates the phase difference signal so as to represent a difference between the rising-side phase difference and the falling-side phase difference.

The data decision circuit in the optical receiver apparatus according to the second aspect of the present invention may have one or any possible combination of the aforementioned additional features (i) to (vi).

Since the data decision circuit according to the first aspect of the present invention is used in the optical receiver apparatus according to the second aspect of the present invention, even when the duty ratio of the input data signal varies, the data value can be determined with high accuracy by flexibly adapting the phase of the clock signal to the variation in the duty ratio of the input data signal. Therefore, when the optical receiver apparatus according to the second aspect of the present invention is used, the quality and reliability of optical transmission can be improved.

The above and other objects, features and advantages of the present invention will become apparent from the following description when taken in conjunction with the accompanying drawings which illustrate preferred embodiment of the present invention by way of example.

DESCRIPTION OF THE PREFERRED EMBODIMENTS

Embodiments of the present invention are explained in detail below with reference to drawings.

(1) Basic Construction of Data Decision Circuit

Figure 1A:
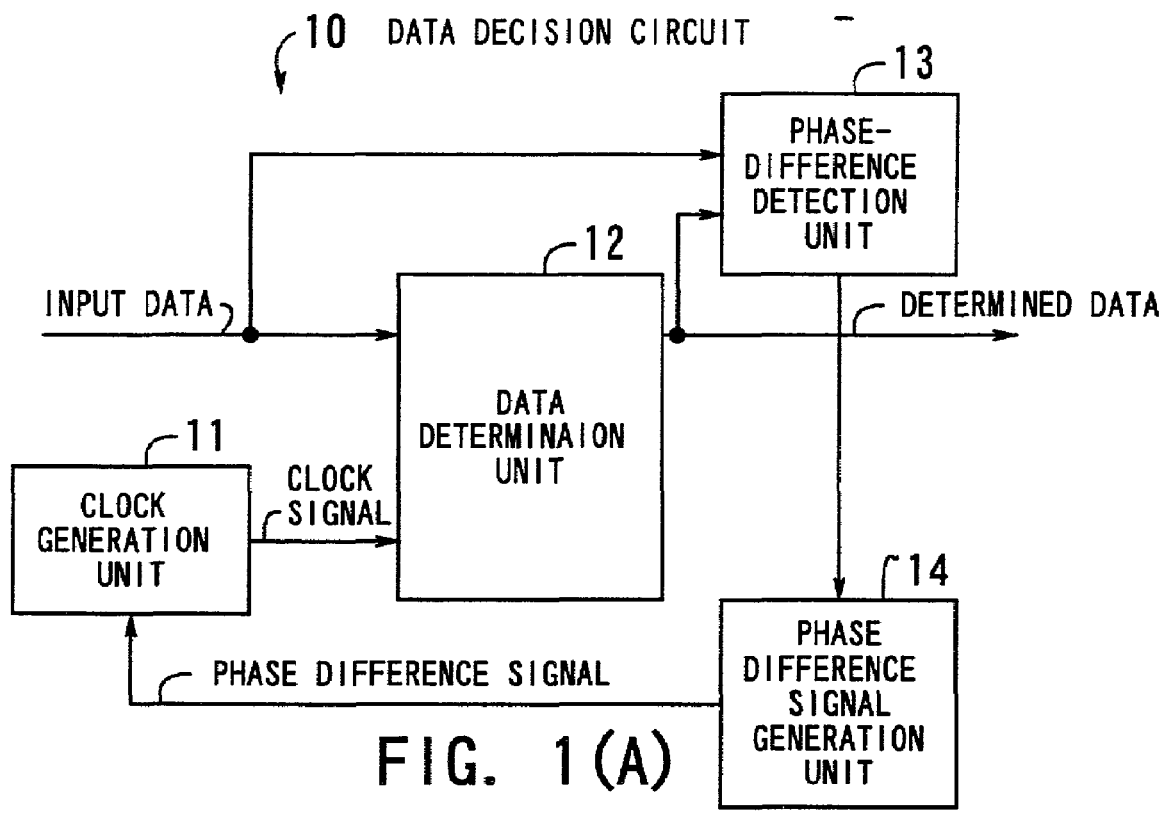
FIG. 1(A) is a diagram illustrating a basic construction of a data decision circuit according to the present invention.

FIG. 1(A) is a diagram illustrating a basic construction of a data decision circuit according to the present invention. The data decision circuit 10 receives a data signal as an input data signal, and determines data values carried by the input data signal.

The data decision circuit 10 comprises a clock generation unit 11, a data determination unit 12, a phase-difference detection unit 13, and a phase-difference-signal generation unit 14.

Figure 1B:
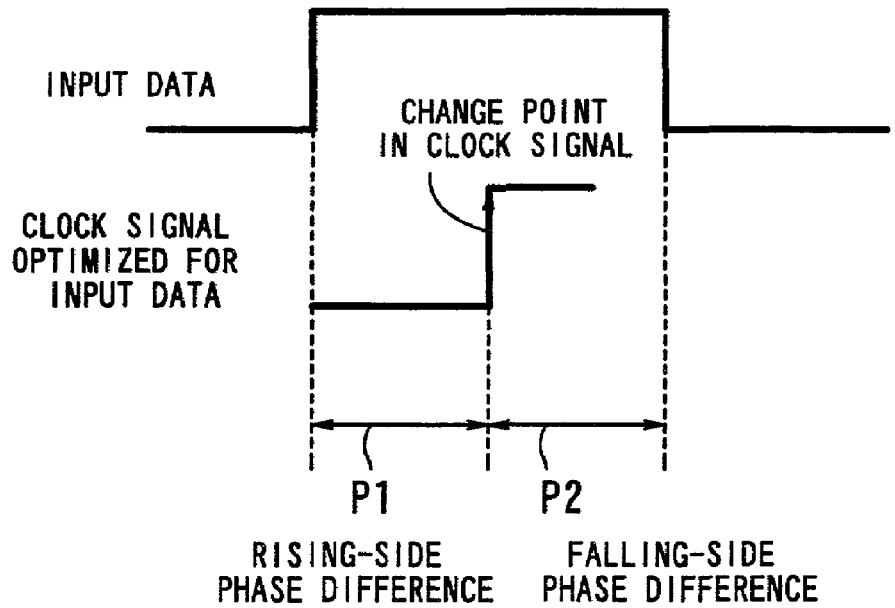
FIG. 1(B) is a timing diagram indicating timings of an input data signal and a clock signal in the data decision circuit of FIG. 1(A)

The clock generation unit 11 generates a clock signal having a transition point at an optimum phase, based on a phase-difference signal output from the phase-difference-signal generation unit 14. Preferably, the optimum phase corresponds to a center phase of a duration of one bit in an input data signal. In this case, a setup time (i.e., a time margin for setting up the data discrimination unit 12) and a data holding time (i.e., a time margin for holding data by the data discrimination unit 12) are equal. The data determination unit 12 determines data values carried by the input data signal by using the clock signal generated by the clock generation unit 11. The phase-difference detection unit 13 detects a rising-side phase difference P1 and a falling-side phase difference P2, where the rising-side phase difference P1 is a phase difference between a rising of the input data signal and a transition of the clock signal which occurs subsequently to the rising of the input data signal, and the falling-side phase difference P2 is a phase difference between the transition in the clock signal and a falling of the input data signal which occurs subsequently to the transition in the clock signal. The phase-difference-signal generation unit 14 generates the phase-difference signal so as to represent a difference between the rising-side phase difference P1 and the falling-side phase difference P2, and supplies the phase-difference signal to the clock generation unit 11. The clock generation unit 11 controls the phase of the clock signal based on the phase-difference signal generated by the phase-difference-signal generation unit 14 so that the difference between the rising-side phase difference P1 and the falling-side phase difference P2 is minimized. As a result, the transition point of the clock signal is set at an optimum phase with respect to the phase of the input data signal as indicated in FIG. 1(B).

(2) Embodiment of Data Decision Circuit

Figure 2:
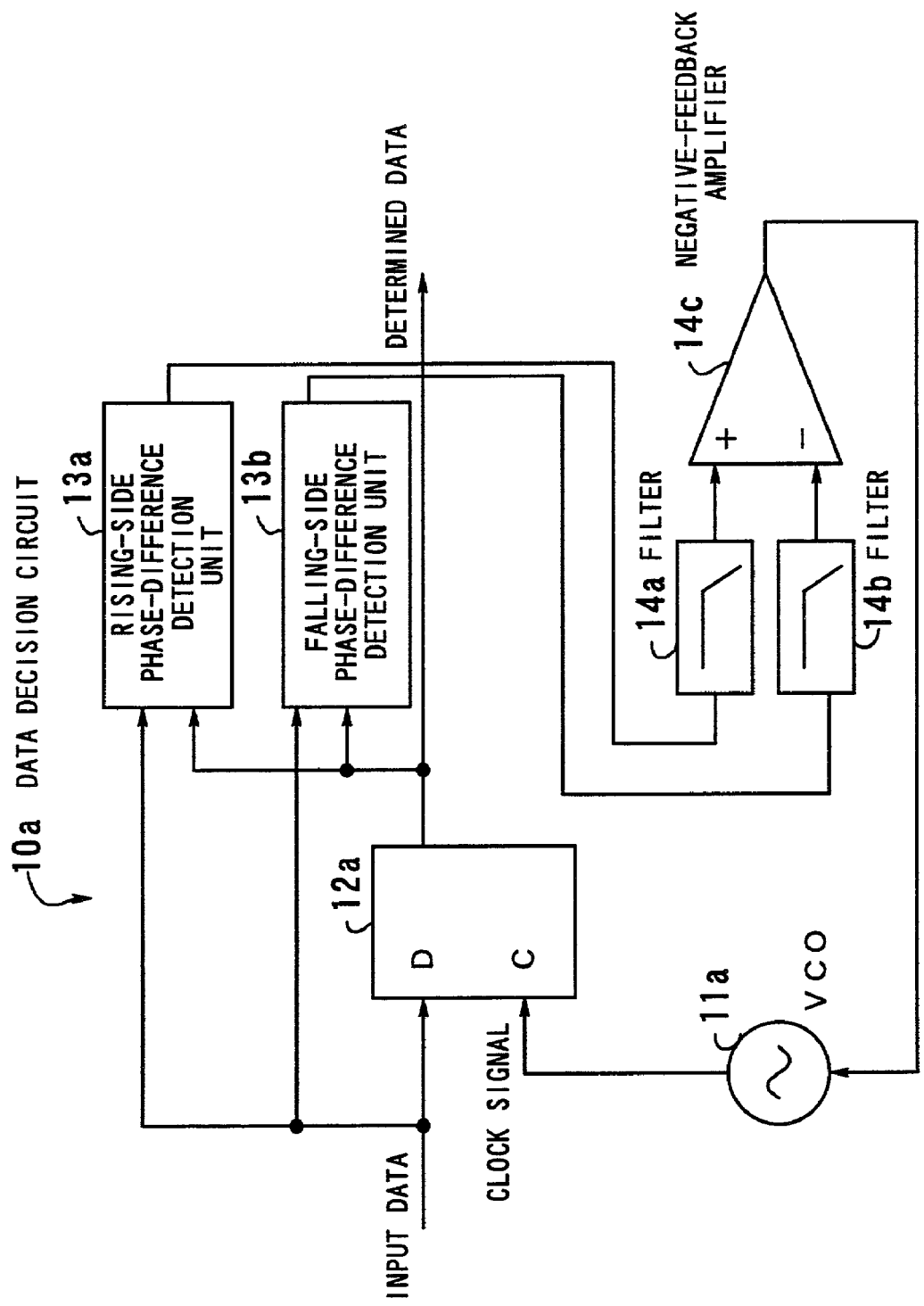
FIG. 2 is a diagram illustrating a construction of a data decision circuit as a first embodiment of the present invention.

FIG. 2 is a diagram illustrating a construction of a data decision circuit as a first embodiment of the present invention. The data decision circuit 10a of FIG. 2 comprises a voltage controlled oscillator (VCO) 11a, a D-type flip-flop circuit 12a, a rising-side phase-difference detection unit 13a, a falling-side phase-difference detection unit 13b, filters 14a and 14b, and a negative-feedback amplifier 14c. The D-type flip-flop circuit 12a corresponds to the data determination unit 12 in the construction of FIG. 1(A), the rising-side phase-difference detection unit 13a and the falling-side phase-difference detection unit 13b constitute the phase-difference detection unit 13 in FIG. 1(A), and the filters 14a and 14 and the negative-feedback amplifier 14c constitute the phase-difference-signal generation unit 14 in FIG. 1(A).

The D-type flip-flop circuit 12a determines a data value of each bit carried by an input data signal. The VCO 11a generates a clock signal which is used by the D-type flip-flop circuit 12a for determining the data value of each bit of the input data signal. The rising-side phase-difference detection unit 13a detects a rising-side phase difference P1 (i.e., a phase difference between a rising of the input data signal and a transition point of the clock signal which occurs subsequently to the rising of the input data signal) based on the input data signal and a signal representing the determined data value (i.e., the output of the D-type flip-flop circuit 12a), and outputs a rising detection pulse representing the rising-side phase difference P1. The falling-side phase-difference detection unit 13b detects a falling-side phase difference P2 (i.e., a phase difference between the transition in the clock signal and a falling of the input data signal which occurs subsequently to the transition in the clock signal) based on the input data signal and the signal representing the determined data value (i.e., the output of the D-type flip-flop circuit 12a), and outputs a falling detection pulse representing the falling-side phase difference P2.

The filter 14a obtains an average of the rising detection pulse, and outputs a first average signal representing the average of the rising detection pulse. The filter 14b obtains an average of the falling detection pulse, and outputs a second average signal representing the average of the falling detection pulse. The negative-feedback amplifier 14c compares the first and second average signals output from the filters 14a and 14b, and outputs a difference between the first and second average signals in the form of a DC voltage, which corresponds to the phase-difference signal output from the phase-difference-signal generation unit 14 in FIG. 1(A). The DC voltage is supplied to the VCO 11a as a control voltage, based on which the VCO 11a controls the oscillation frequency of the clock signal.

Figure 3A:
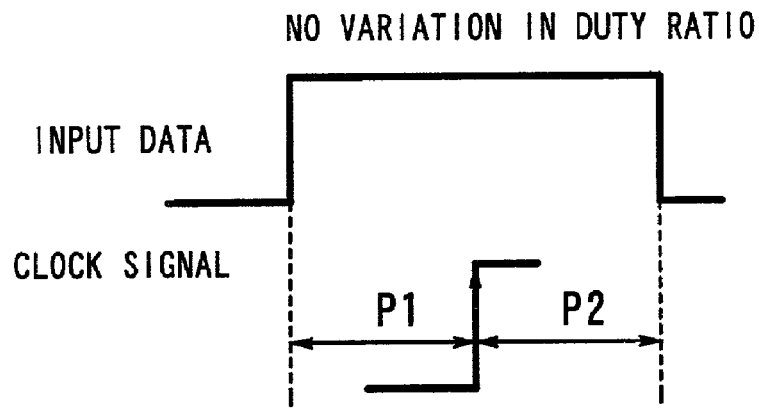
FIG. 3(A) is a timing diagram indicating timings of an input data signal and a clock signal in the data decision circuit of FIG. 2 when a duty ratio of an input data signal does not vary.
Figure 3B:
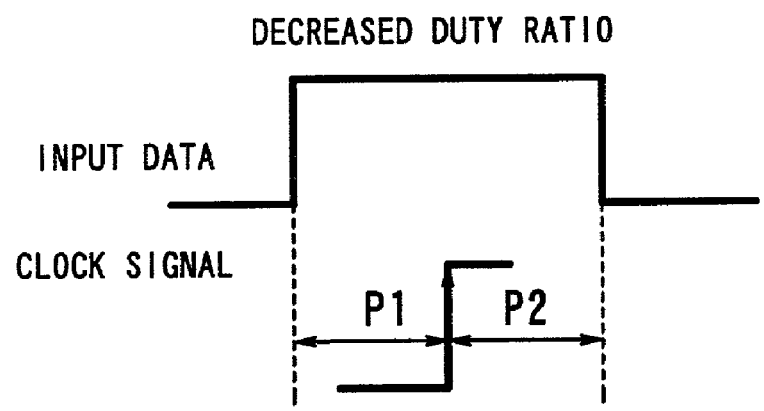
FIG. 3(B) is a timing diagram indicating timings of the input data signal and the clock signal in the data decision circuit of FIG. 2 when the duty ratio of the input data signal decreases.
Figure 3C:
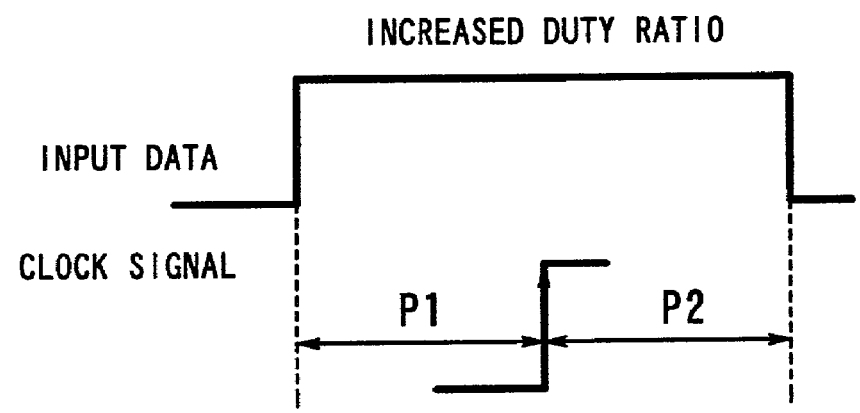
FIG. 3(C) is a timing diagram indicating timings of the input data signal and the clock signal in the data decision circuit of FIG. 2 when the duty ratio of the input data signal increases.

FIG. 3(A) is a timing diagram indicating timings of an input data signal and a clock signal in the data decision circuit 10a of FIG. 2 when the duty ratio of the input data signal does not vary, FIG. 3(B) is a timing diagram indicating timings of the input data signal and the clock signal when the duty ratio of the input data signal decreases, and FIG. 3(C) is a timing diagram indicating timings of the input data signal and the clock signal when the duty ratio of the input data signal increases. As indicated in FIGS. 3(A) to 3(C), the data decision circuit 10a operates so that the rising-side phase difference P1 and the falling-side phase difference P2 are equalized. That is, the setup time (i.e., the time margin for setting up the D-type flip-flop circuit 12a) and the data holding time (i.e., the time margin for holding data in the D-type flip-flop circuit 12a) are equalized. In particular, even when the duty ratio of the input data signal decreases or increases, the rising-side phase difference P1 and the falling-side phase difference P2 are equalized according to the decrease or increase in the duty ratio of the input data signal. Thus, the transition point of the clock signal is maintained at the center phase in a duration of each bit of the input data signal, and the data value of each bit of the input data signal can be determined without causing any errors. Therefore, the data decision circuit 10a can operate stably, and the data decision circuit 10a can determine data values carried by the input data signal with high accuracy.

Figure 4A:
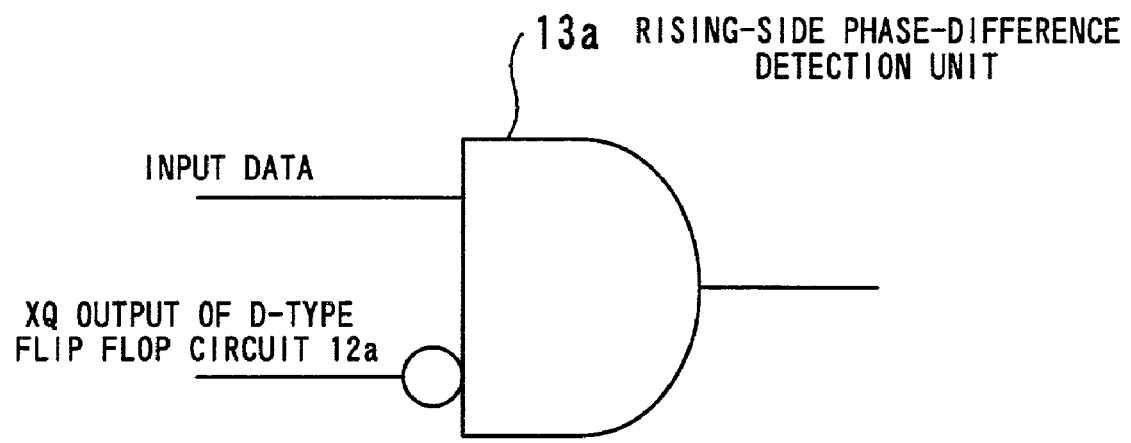
FIG. 4(A) is a diagram illustrating a concrete example of the rising-side phase-difference detection unit 13a in the data decision circuit of FIG. 2.
Figure 4B:
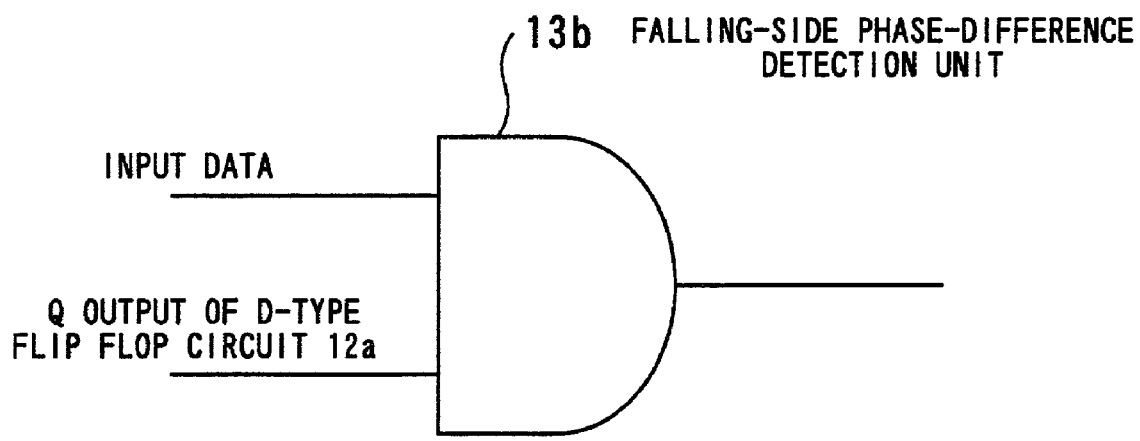
FIG. 4(B) is a diagram illustrating a concrete example of the falling-side phase-difference detection unit 13b in the data decision circuit of FIG. 2.

Next, the rising-side phase-difference detection unit 13a and the falling-side phase-difference detection unit 13b are explained below. FIGS. 4(A) and 4(B) show concrete examples of the rising-side phase-difference detection unit 13a and the falling-side phase-difference detection unit 13b in the data decision circuit 10a of FIG. 2. In these examples, each of the of the rising-side phase-difference detection unit 13a and the falling-side phase-difference detection unit 13b is realized by an AND circuit. That is, the rising-side phase-difference detection unit 13a obtains a logical product of the input data signal and the inverted output of the D-type flip-flop circuit 12a, and the falling-side phase-difference detection unit 13b obtains a logical product of the input data signal and the non-inverted output of the D-type flip-flop circuit 12a.

Figure 5:
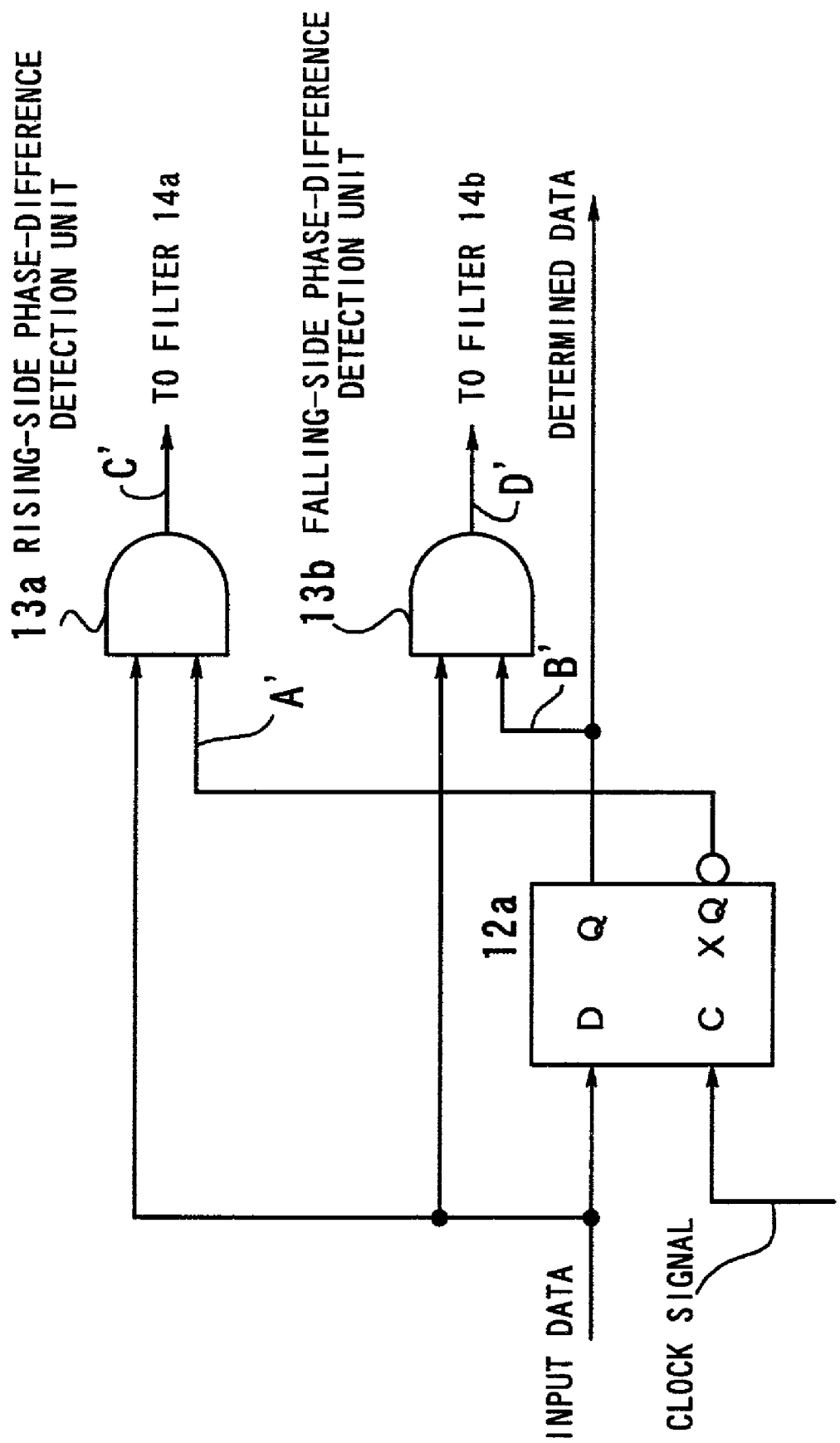
FIG. 5 is a diagram illustrating connections between the D-type flip-flop circuit 12a and each of the rising-side phase-difference detection unit 13a and the falling-side phase-difference detection unit 13b in the data decision circuit of FIG. 2.

FIG. 5 is a diagram illustrating connections between the D-type flip-flop circuit 12a and each of the rising-side phase-difference detection unit 13a and the falling-side phase-difference detection unit 13b in the data decision circuit 10a of FIG. 2. As illustrated in FIG. 5, the first input terminal of the rising-side phase-difference detection unit 13a is connected to the data input (D) terminal of the D-type flip-flop circuit 12a, the second input terminal of the rising-side phase-difference detection unit 13a is connected to the non-inverted output (XQ) terminal of the D-type flip-flop circuit 12a, the first input terminal of the falling-side phase-difference detection unit 13b is also connected to the data input (D) terminal of the D-type flip-flop circuit 12a, and the second input terminal of the falling-side phase-difference detection unit 13b is connected to the non-inverted output (Q) terminal of the D-type flip-flop circuit 12a. The rising detection pulse and the falling detection pulse, which are output from the rising-side phase-difference detection unit 13a and the falling-side phase-difference detection unit 13b, are supplied to the filters 14a and 14b, respectively.

Figure 6A:
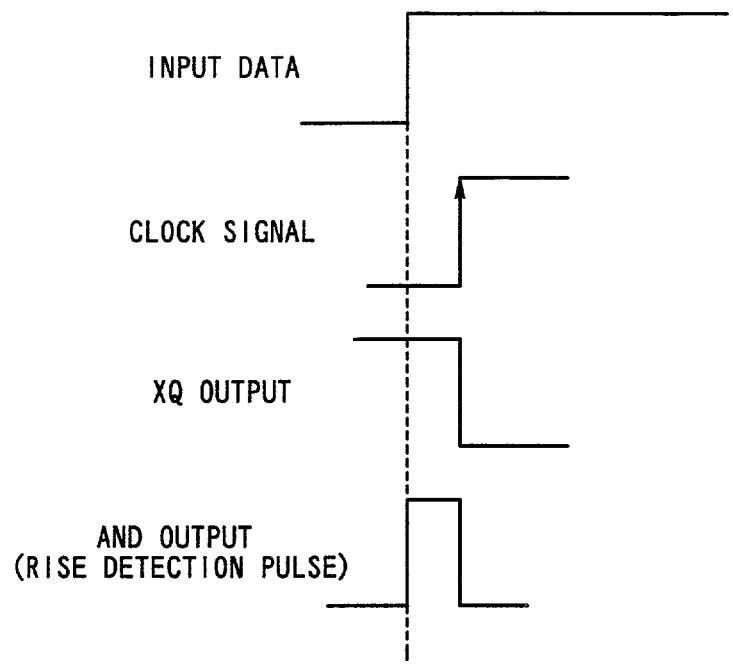
FIG. 6(A) is a timing diagram indicating timings of an input data signal, a clock signal, an XQ output of the D-type flip-flop circuit 12a, and an AND output of the rising-side phase-difference detection unit 13a in the data decision circuit of FIG. 2.
Figure 6B:
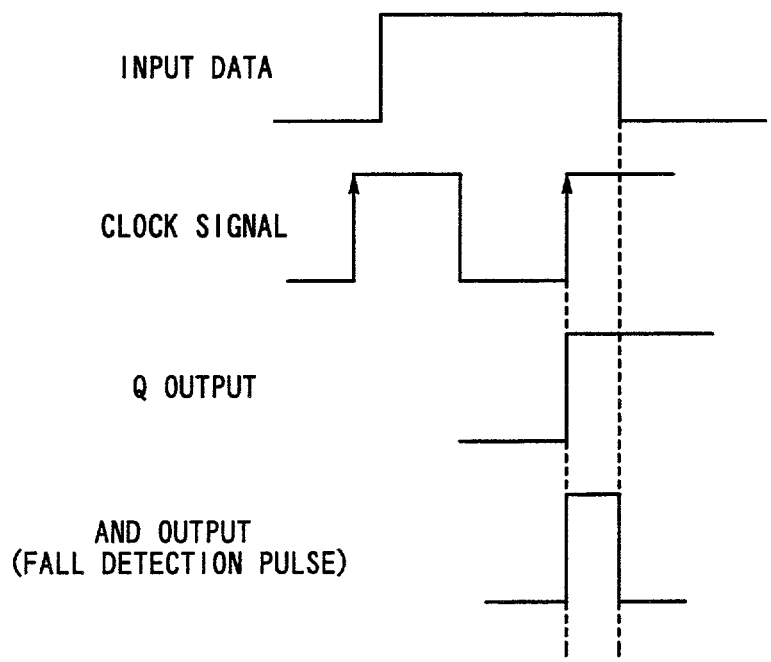
FIG. 6(B) is a timing diagram indicating timings of an input data signal, a clock signal, a Q output of the D-type flip-flop circuit 12a, and an AND output of the falling-side phase-difference detection unit 13b in the data decision circuit of FIG. 2.

FIG. 6(A) shows timings of the input data signal, the clock signal, the XQ output of the D-type flip-flop circuit 12a, and the AND output of the rising-side phase-difference detection unit 13a in the data decision circuit 10a of FIG. 2, and FIG. 6(B) shows timings of the input data signal, the clock signal, the Q output of the D-type flip-flop circuit 12a, and the AND output of the falling-side phase-difference detection unit 13b in FIG. 2. The rising detection pulse output from the rising-side phase-difference detection unit 13a rises with the rising of the input data signal and falls with the transition (rising) in the clock signal as indicated in FIG. 6(A), and the falling detection pulse output from the falling-side phase-difference detection unit 13b rises with the transition (rising) in the clock signal and falls with the falling of the input data signal as indicated in FIG. 6(B).

Figure 7:
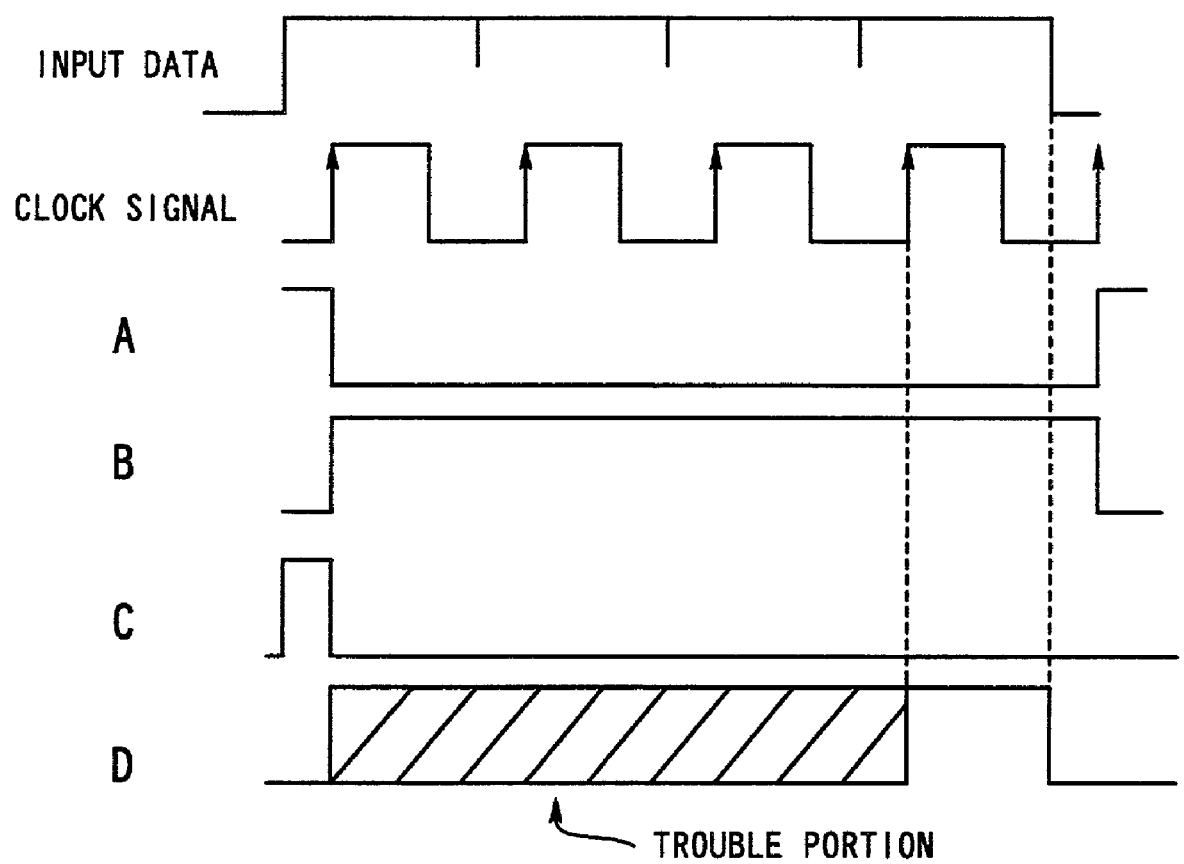
FIG. 7 is a timing diagram indicating timings of an input data signal, a clock signal, and signals A', B', C', and D' in the circuit of FIG. 5 when the circuit causes a problem.

FIG. 7 is a timing diagram indicating timings of the input data signal, the clock signal, and the signals A', B', C', and D' in the circuit of FIG. 5 when the circuit causes a problem.

When the input data signal is a non-return-to-zero (NRZ) signal, and more than one successive bit represented by the input data signal has an identical value, the falling-side phase-difference detection unit 13b outputs an unnecessarily wide pulse as indicated by hatching in FIG. 7, and therefore the output D' of the falling-side phase-difference detection unit 13b does not accurately represent the falling-side phase difference P2. As a result, the phase difference signal, which is generated based on the rising-side phase difference P1 and the falling-side phase difference P2, becomes inaccurate. Namely, the data decision circuit 10a in FIG. 2 causes a problem when more than one successive bit represented by the NRZ input data signal has an identical value.

(3) First Improvement

Figure 8:
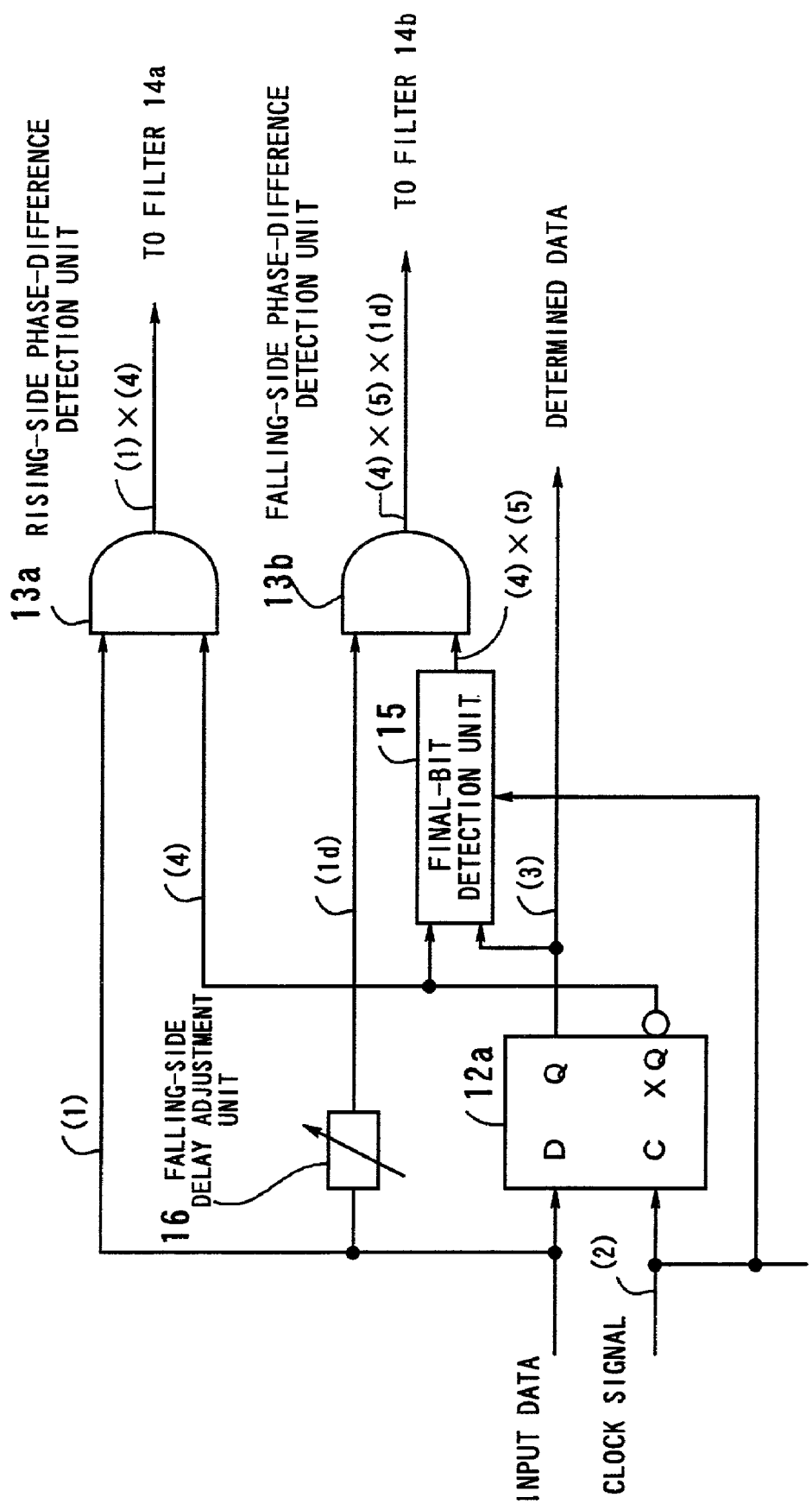
FIG. 8 is a diagram illustrating a first improvement on the circuit of FIG. 5.

FIG. 8 is a diagram illustrating a first improvement on the circuit of FIG. 5. The first improvement illustrated in FIG. 8 is made for solving the problem as indicated in FIG. 7. In the construction of FIG. 8, a final-bit detection unit 15 is provided between the D-type flip-flop circuit 12a and the second input terminal of the falling-side phase-difference detection unit 13b, and a falling-side delay adjustment unit 16 is provided in the stage preceding the second input terminal of the rising-side phase-difference detection unit 13a. When more than one successive bit represented by the input data signal has an identical value, and the Q output of the D-type flip-flop circuit 12a has a large width corresponding to the more than one successive bit, the final-bit detection unit 15 detects the final bit of the more than one successive bit and outputs a pulse having a width corresponding to only the final bit, and the output of the final-bit detection unit 15, instead of the Q output of the D-type flip-flop circuit 12a, is supplied to the second input terminal of the falling-side phase-difference detection unit 13b.

In addition, the falling-side delay adjustment unit 16 is arranged as indicated in FIG. 8 in order to compensate for a delay caused by the provision of the final-bit detection unit 15. Further, the delay produced by the falling-side delay adjustment unit 16 can be externally adjusted. In this case, the phase at which each data value carried by the input data signal is determined can be externally changed, and the data decision circuit can be geared to changes in transmission characteristics caused by change in the waveshapes of transmitted signals.

Figure 9:
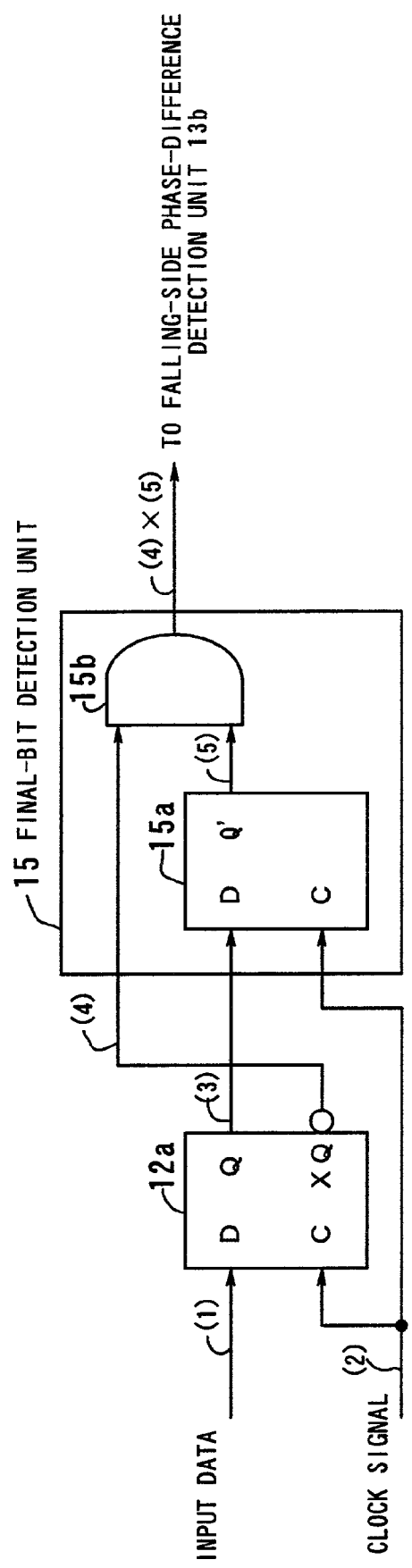
FIG. 9 is a diagram illustrating a concrete example of the final-bit detection unit 15 in the circuit of FIG. 8.

FIG. 9 is a diagram illustrating a concrete example of the final-bit detection unit 15 used in the circuit of FIG. 8. The final-bit detection unit 15 in FIG. 9 is constituted by a D-type flip-flop circuit 15a and an AND circuit 15b. The D input terminal of the D-type flip-flop circuit 15a is connected to the Q output terminal of the D-type flip-flop circuit 12a, and the clock signal is supplied to the clock (C) input terminal of the D-type flip-flop circuit 12a. The first input terminal of the AND circuit 15b is connected to the XQ output of the D-type flip-flop circuit 12a, and the second input terminal of the AND circuit 15b is connected to the Q output terminal of the D-type flip-flop circuit 15a. The output of the AND circuit 15b is supplied to the second input terminal of the AND circuit as the falling-side phase-difference detection unit 13b in FIG. 8.

Figure 10:
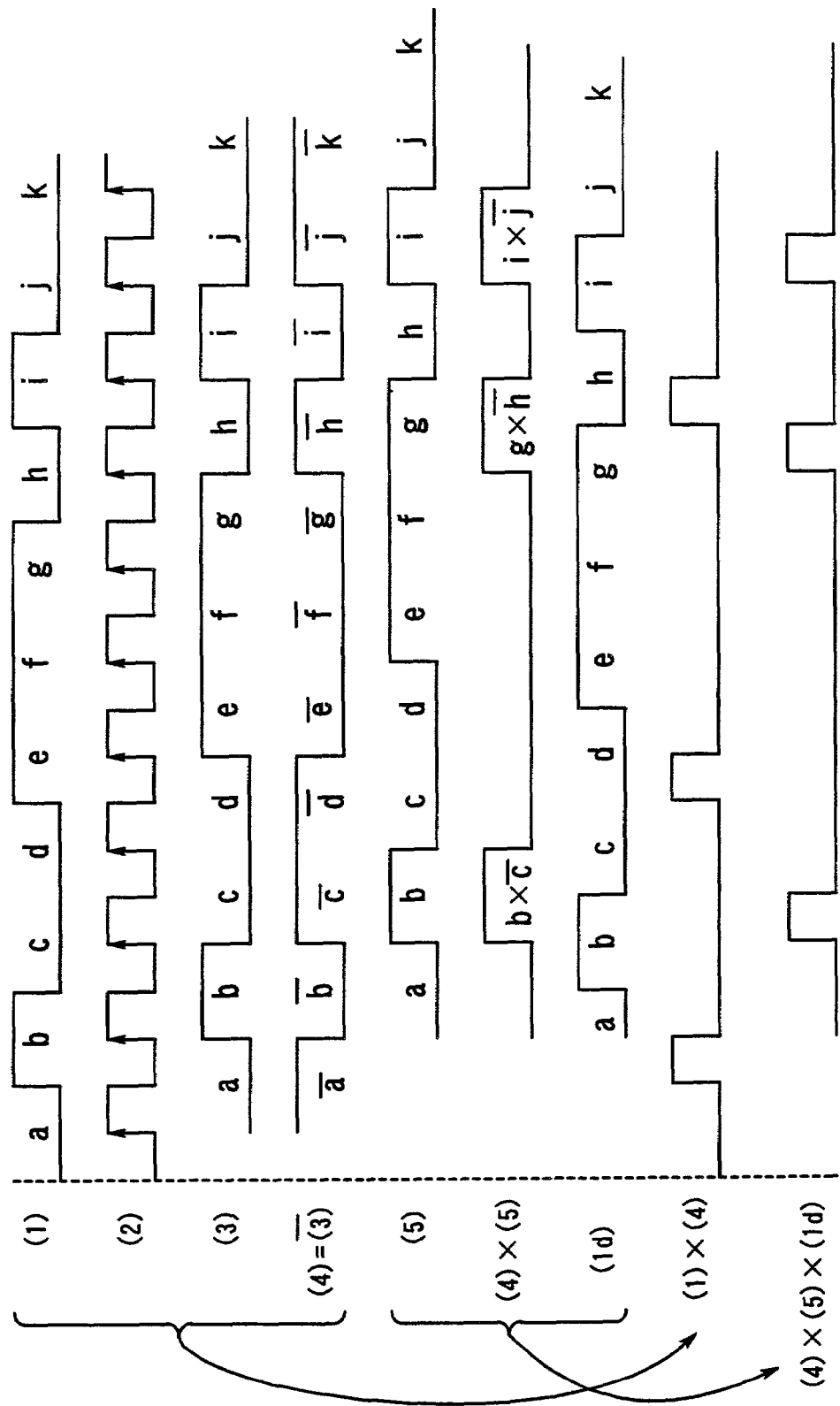
FIG. 10 is a timing diagram indicating timings of signals in an example of an operation of the circuit of FIG. 8 until the data decision circuit outputs a rising detection pulse and a falling detection pulse.

FIG. 10 is a timing diagram indicating timings of signals in operations of the circuit of FIG. 8 until the data decision circuit outputs the rising detection pulse and the falling detection pulse. The phases of the input data signal (1) and the clock signal (2) have the relationship as illustrated in FIG. 10. When the D-type flip-flop circuit 12a receives the above input data (1) and clock signal (2), the D-type flip-flop circuit 12a outputs the Q output (3) and the XQ output (4) as illustrated in FIG. 10. The rising-side phase-difference detection unit 13a receives the input data signal (1) and the XQ output (4), and outputs a logical product (1)×(4) as the rising detection pulse. The D-type flip-flop circuit 15a delays the Q output by one bit, and outputs the delayed Q output as a Q' output (5). The AND circuit 15b receives the XQ output (4) and the Q' output (5), and outputs a logical product (4)×(5) as the aforementioned pulse having the width corresponding to the final bit. On the other hand, the falling-side delay adjustment unit 16 delays the input data signal (1) by an amount illustrated in FIG. 10, and outputs the delayed input data (1d). The falling-side phase-difference detection unit 13b receives the output (4)×(5) of the AND circuit 15b and the delayed input data (1d), and outputs a logical product (4)×(5)×(1d) as the falling detection pulse.

When the data decision circuit of FIG. 2 is modified so as to include the final-bit detection unit 15 and the falling-side delay adjustment unit 16 as illustrated in FIGS. 8 and 9, the problem explained before with reference to FIG. 7 does not arise even when more than one successive bit represented by the input data signal has an identical value, and the rising-side phase difference P1 and the falling-side phase difference P2 can be correctly detected.

(4) Second Improvement

Figure 11:
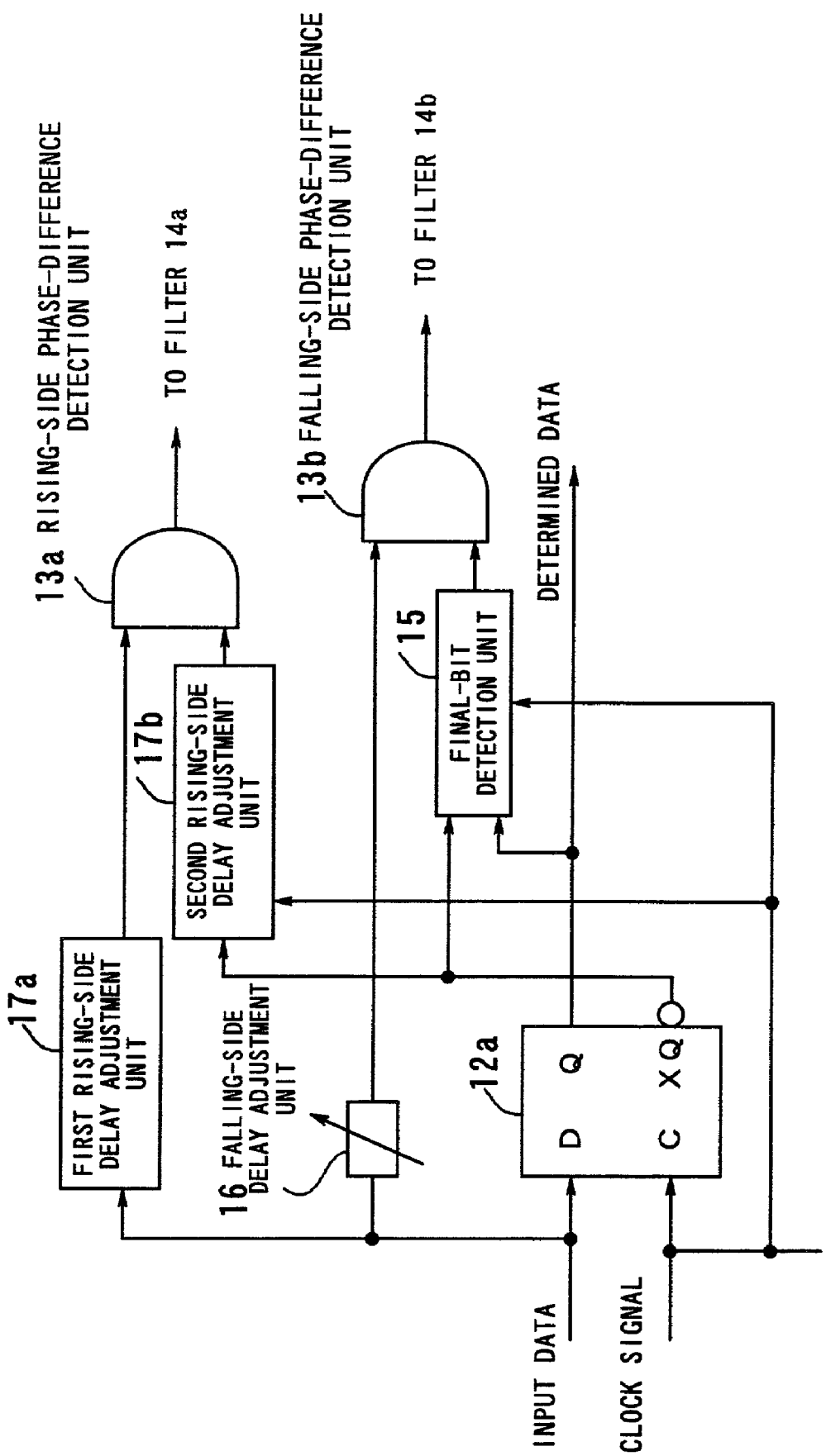
FIG. 11 is a diagram illustrating a second improvement on the circuit of FIG. 5.

FIG. 11 is a diagram illustrating a second improvement on the circuit of FIG. 5. The second improvement illustrated in FIG. 11 is also made for solving the problem as indicated in FIG. 7 and further improving the circuit of FIG. 8. In the construction of FIG. 11, delay adjustment is made for each of the rising-side phase-difference detection and the falling-side phase-difference detection. That is, the circuit of FIG. 11 is provided with a first rising-side delay adjustment unit 17a in the stage preceding the first input terminal of the rising-side phase-difference detection unit 13a and a second rising-side delay adjustment unit 17b in the stage preceding the second input terminal of the rising-side phase-difference detection unit 13a, in addition to the final-bit detection unit 15 and the falling-side delay adjustment unit 16 explained with reference to FIG. 8. The first and second rising-side delay adjustment units 17a and 17b are provided in consideration of possible variations in a delay caused in the falling-side phase-difference detection by variations in temperature and other operational conditions.

The first rising-side delay adjustment unit 17a delays the input data signal, and supplies the delayed input data signal to the first input terminal of the rising-side phase-difference detection unit 13a, and the second rising-side delay adjustment unit 17b delays the XQ output of the D-type flip-flop circuit 12a, and supplies the delayed XQ output to the second input terminal of the rising-side phase-difference detection unit 13a. The second rising-side delay adjustment unit 17b can be realized by a D-type flip-flop circuit, and delay the XQ output of the D-type flip-flop circuit 12a by using the clock signal.

(5) Embodiment of Optical Receiver Apparatus

Figure 12:
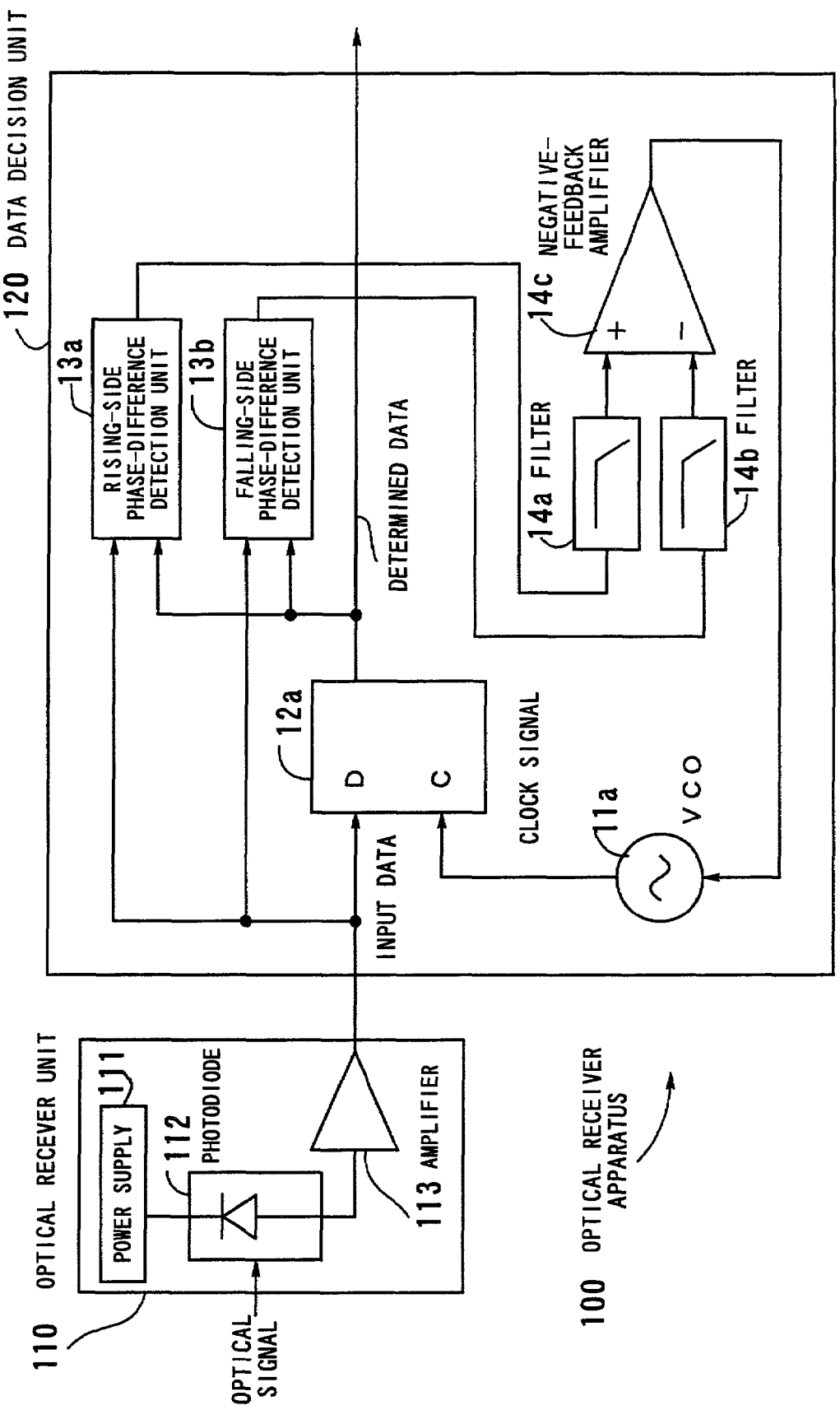
FIG. 12 is a diagram illustrating a construction of an optical receiver apparatus as a second embodiment of the present invention.
Figure 13A:
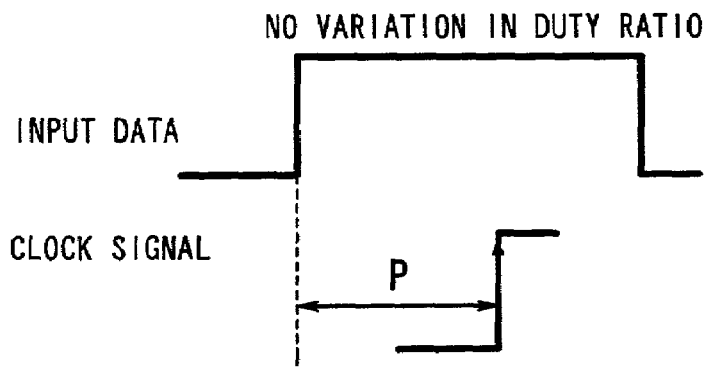
FIG. 13(A) is a timing diagram indicating timings of the input data signal and the clock signal in a conventional data decision circuit when the duty ratio of the input data signal does not vary.
Figure 13B:
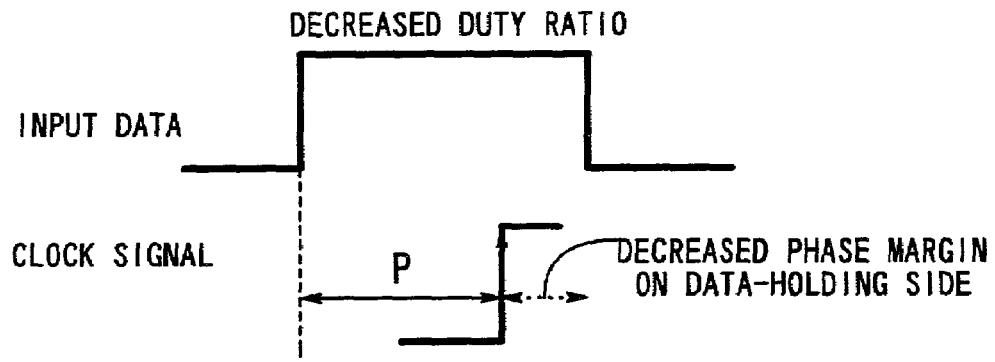
FIG. 13(B) is a timing diagram indicating timings of the input data signal and the clock signal in a conventional data decision circuit when the duty ratio of the input data signal decreases.
Figure 13C:
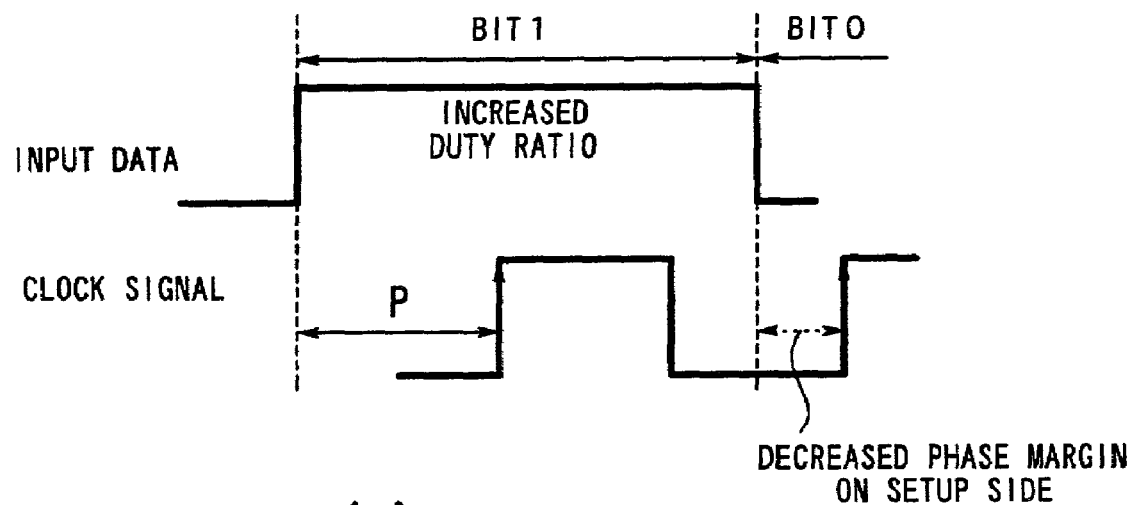
FIG. 13(C) is a timing diagram indicating timings of the input data signal and the clock signal in a conventional data decision circuit when the duty ratio of the input data signal increases.

FIG. 12 is a diagram illustrating a construction of an optical receiver apparatus as a second embodiment of the present invention. The optical receiver apparatus 100 of FIG. 12 comprises an optical receiver unit 110 and a data decision unit 120. The data decision unit 120 can be realized by the aforementioned data decision circuit as the first embodiment of the present invention.

The optical receiver unit 110 comprises a power supply 111, a photodiode 112, and an amplifier 113. The photodiode 112 is biased with a voltage supplied from the power supply 111. When the photodiode 112 receives an optical signal carrying data, the photodiode 112 converts the optical signal into an electric signal carrying the data. The amplifier 113 amplifies the electric signal, and outputs the amplified electric signal to the data decision unit 120. The data decision unit 120 determines the data values carried by the electric signal.

(6) Advantages and Other Matters (i) As explained above, in the data decision circuit and the optical receiver apparatus according to the present invention, the rising-side phase difference P1 and the falling-side phase difference P2 are detected, and the clock signal used in determination of data values carried by an input data signal is controlled so that the phase of the clock signal is maintained at an optimum phase with respect to the input data signal. Therefore, even when the duty ratio of the input data signal varies, it is possible to equalize the phase difference between a rising of the input data signal and a transition in the clock signal occurring subsequent to the rising of the input data signal and the phase difference between the transition in the clock signal and a falling of the input data signal occurring subsequent to the transition in the clock signal. This is the optimum condition for eliminating instability caused by the variation in the duty ratio of the input data signal, and realizing a stable operation. Therefore, the quality and reliability of the data decision circuit and the optical receiver apparatus can be improved.

(ii) In addition, the data decision circuit according to the present invention can be used in various communication apparatuses in which data decision and data recovery are made, as well as in the optical communication devices such as the above optical receiver apparatus.

(iii) The foregoing is considered as illustrative only of the principle of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

(iv) In addition, all of the contents of the Japanese patent application, No.2001-119438 are incorporated into this specification by reference.

What is claimed is:

1. A data decision circuit comprising:
   a clock generation unit which generates a clock signal based on a phase difference signal so that the clock signal has an optimum phase with respect to a phase of an input data signal;
   a data determination unit which determines data carried by said input data signal, by using said clock signal, and generates a determined data signal representing the determined data values;
   a phase-difference detection unit which detects a rising-side phase difference and a falling-side phase difference, where the rising-side phase difference is a phase difference between a rising of the input data signal and a transition in the clock signal which occurs subsequently to the rising of the input data signal, and the falling-side phase difference is a phase difference between the transition in the clock signal and a falling of the input data signal which occurs subsequently to the transition in the clock signal;
   wherein said phase-difference detection unit generates a first pulse representing said rising-side phase difference by obtaining a logical product of said input data signal and an inversion of said determined data signal, and a second pulse representing said falling-side phase difference by obtaining a logical product of said input data signal and the determined data signal; and
   a phase-difference-signal generation unit which generates said phase difference signal so as to represent a difference between said rising-side phase difference and said falling-side phase difference.

2. A data decision circuit according to claim 1, wherein said clock generation unit is realized by a voltage controlled oscillator, and generates said clock signal so as to minimize said difference between said rising-side phase difference and said falling-side phase difference.

3. A data decision circuit according to claim 1, wherein said phase-difference-signal generation unit comprises,
   a first filter which obtains an average of said first pulse so as to produce a first average signal representing the average of said first pulse,
   a second filter which obtains an average of said second pulse so as to produce a second average signal representing the average of said second pulse, and
   an amplifier which generates and amplifies a difference between said first average signal and said second average signal so as to produce said phase difference signal and negatively feed back the phase difference signal to said clock generation unit.

4. A data decision circuit according to claim 1, wherein said phase-difference detection unit comprises,
   a final-bit detection unit which detects a final bit of a plurality of successive bits having an identical value, and generates a pulse having a width corresponding to only the final bit, for use in detection of said falling-side phase difference, when the input data signal carries the plurality of successive bits, and
   a falling-side delay adjustment unit which allows adjustment of a delay in said input data signal supplied to said phase-difference detection unit so as to compensate for a delay which is caused in the determined data signal by the final-bit detection unit.

5. A data decision circuit according to claim 4, wherein said falling-side delay adjustment unit allows external adjustment of the delay in said input data signal supplied to said phase-difference detection unit.

6. A data decision circuit according to claim 4, wherein said phase-difference detection unit further comprises a rising-side delay adjustment unit which is arranged in a portion of said phase-difference detection unit in which said rising-side phase difference is detected, and allows adjustment of a delay in detection of said rising-side phase difference in order to compensate for variations in a delay caused during detection of said falling-side phase difference.

7. An optical receiver apparatus including an optical receiver unit and a data decision circuit;
   said optical receiver unit receives an optical signal and converts the optical signal into an electric signal as an input data signal; and
   said data decision circuit comprises,
      a clock generation unit which generates a clock signal based on a phase difference signal so that the clock signal has an optimum phase with respect to a phase of said input data signal,
      a data determination unit which determines data carried by said input data signal, by using said clock signal, and generates a determined data signal representing the determined data values,
      a phase-difference detection unit which detects a rising-side phase difference and a falling-side phase difference, where the rising-side phase difference is a phase difference between a rising of the input data signal and a transition in the clock signal which occurs subsequently to the rising of the input data signal, and the falling-side phase difference is a phase difference between the transition in the clock signal and a falling of the input data signal which occurs subsequently to the transition in the clock signal,
   wherein said phase-difference detection unit generates a first pulse representing said rising-side phase difference by obtaining a logical product of said input data signal and an inversion of said determined data signal, and a second pulse representing said falling-side phase difference by obtaining a logical product of said input data signal and the determined data signal; and
      a phase-difference-signal generation unit which generates said phase difference signal so as to represent a difference between said rising-side phase difference and said falling-side phase difference.

* * * * *